United States Patent
Holt

(10) Patent No.: US 8,114,569 B2
(45) Date of Patent: Feb. 14, 2012

(54) MASKLESS PHOTOPOLYMER EXPOSURE PROCESS AND APPARATUS

(75) Inventor: Paul Mayo Holt, Peterborough (GB)

(73) Assignee: Photocentric Limited (GB)

( * ) Notice: Subject to any disclaimer, the term of this patent is extended or adjusted under 35 U.S.C. 154(b) by 533 days.

(21) Appl. No.: 12/302,972

(22) PCT Filed: May 29, 2007

(86) PCT No.: PCT/GB2007/050301
§ 371 (c)(1),
(2), (4) Date: Dec. 1, 2008

(87) PCT Pub. No.: WO2007/138356
PCT Pub. Date: Dec. 6, 2007

(65) Prior Publication Data
US 2009/0190107 A1    Jul. 30, 2009

(30) Foreign Application Priority Data
May 30, 2006    (GB) .................................. 0610606.6

(51) Int. Cl.
*G03F 7/20* (2006.01)
(52) U.S. Cl. ..................... 430/270.1; 430/300
(58) Field of Classification Search ............... 430/270.1, 430/300
See application file for complete search history.

(56) References Cited

U.S. PATENT DOCUMENTS

| | | | |
|---|---|---|---|
| 5,049,901 A | 9/1991 | Gelbart | |
| 6,335,144 B1 * | 1/2002 | Murota et al. | 430/281.1 |
| 6,425,669 B1 * | 7/2002 | Mei et al. | 353/122 |
| 6,468,711 B1 | 10/2002 | Sorori et al. | |
| 6,683,421 B1 | 1/2004 | Kennedy et al. | |
| 2002/0144616 A1 | 10/2002 | Carlson | |
| 2003/0039915 A1 * | 2/2003 | Holt et al. | 430/270.1 |
| 2003/0107059 A1 | 6/2003 | Chen | |
| 2005/0170285 A1 | 8/2005 | Sugasaki et al. | |
| 2006/0024614 A1 | 2/2006 | Williamson | |
| 2006/0216646 A1 | 9/2006 | Goto et al. | |
| 2007/0046771 A1 * | 3/2007 | Luellau et al. | 347/239 |

FOREIGN PATENT DOCUMENTS

| | | |
|---|---|---|
| EP | 0 097 012 | 6/1883 |
| EP | 0453307 | 10/1991 |
| EP | 0 552 953 | 1/1993 |
| EP | 1 048 982 | 11/2000 |
| EP | 1 070 990 | 1/2001 |
| EP | 1235107 | 8/2002 |
| GB | 2 372 575 | 8/2002 |
| JP | 6242612 | 9/1994 |
| WO | WO 0190814 | 11/2001 |
| WO | WO 03/014832 | 2/2003 |
| WO | 03069411 | 8/2003 |
| WO | WO 2004/021080 | 3/2004 |
| WO | WO 2005/052853 | 6/2005 |
| WO | WO 2006/007978 | 1/2006 |
| WO | WO 2006/079788 | 8/2006 |

OTHER PUBLICATIONS

International Search Report.

* cited by examiner

*Primary Examiner* — Shean Wu
(74) *Attorney, Agent, or Firm* — Renner Kenner Greive Bobak Taylor & Weber

(57) ABSTRACT

A process for curing photopolymer which comprises exposing the photopolymer to an image produced by a mask-free imaging apparatus. The image may be generated by a monochromatic display screen, e.g. a liquid crystal display, light emitting diodes, a cathode ray tube or plasma screen.

2 Claims, No Drawings

MASKLESS PHOTOPOLYMER EXPOSURE PROCESS AND APPARATUS

FIELD OF THE INVENTION

The present invention relates to a process and apparatus for exposing a photocurable composition which is used to make an image recording material, for example a synthetic resin relief printing plate, colour proof, photoresist and colour filter used in three dimensional stereolithography, holography, lithographic printing plate, flexographic printing plate, moulding plate or for an ink, a coating material, an adhesive or the like.

BACKGROUND TO THE INVENTION

Lithographic and flexographic photopolymer printing plates may be formed by curing (hardening) a photocurable compound using light.

The image may be formed in a manner known as computer to film (CTF) which utilises the interposition of a masking element (e.g. a photographic negative) between the photopolymer and the light source, the mask preventing light from reaching the parts of the photopolymer where no ink transference in the finished plate is intended. After exposure, the uncured material is then typically removed by washing, e.g. in a solvent. This process involves the creation of a separate masking element, which is costly, time consuming and an impairment to image quality.

Alternatively it may be formed in a manner known as computer to plate (CTP) also referred to as digital printing; here the image may be formed by fixing the wanted parts using energy from a laser or alternatively removing unwanted parts using laser energy. The printing industry is currently moving towards digital printing to increase production speed, quality of reproduction and ease of use.

The process of forming the image by scanning the resin with laser light results in the exposure of any area of resin occurring in a very short time, for example a fraction of a second. The result can be insufficient polymerisation and, therefore, a poor quality printed image.

Photopolymer used to make flexographic printing plates may be supplied in the form of a solid sheet, in liquid form which is poured and levelled at its point of use, or by use of a pre-made sachet containing liquid polymer. Lithographic photopolymer may be supplied as a thin photo or heat sensitive coating on a suitable backing substrate such as aluminium sheet.

Typical liquid photopolymers which may be used to make flexographic polymer printing plates include, for example, unsaturated polyurethane resins, e.g. polyether urethane polymers, or polyether polyester urethane copolymers such as, for example, polyether polyester urethane methacrylate polymers. Suitable cured polymers for use in making flexographic printing plates for packaging applications have a Shore A durometer hardness of between 20 and 35, those for making hand stamps more typically have a Shore A durometer hardness of between 40 and 58 and those for making embossing or moulding plates have a Shore A durometer hardness of 90. Polymers having characteristics described in this paragraph and the following paragraphs may be used in the invention described below.

Typical lithographic photopolymer plates contain formulations containing a polymerizable monomer, a binder, a photoinitiator and a sensitizing dye. In conventional, 'wet' lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In 'driographic' printing, the lithographic image consists of ink-accepting and ink-repelling areas and during driographic printing, only ink is supplied to the master.

The photopolymerisable compound in either flexographic or lithographic printing will in commercial practice include a photoinitiator in the known way. Such conventional photoinitiators are typically organic carbonyl compounds. Typically these organic carbonyl compounds are activated outside the daylight part of the spectrum.

Recent developments in photopolymerisable compounds have led to changes in the photoinitiators utilised in starting the polymerisation process by bringing their activity region into the visible part of the spectrum.

These developments have advantages in the manufacture of lithographic plates in that they enable the use of commonly available, low cost and low energy use blue light DVD lasers. EP-A-1048982 and EP-A-1070990 disclose the use of a titanocene photoinitiator in combination with a visible light absorbing dye to enable the use of lasers emitting light in the region of 350 to 450 nm.

International patent application WO 2006/079788 describes a liquid photopolymer preparation, usable in the invention of this specification, adapted to cure under ambient light. The photopolymer here may include a photoinitiator that is activated at wavelengths of over 400 nm. These liquid photopolymer preparations contain photoinitiators such as aromatic phosphine oxides such as bis-acylphosphineoxide, or more preferably metallocene compounds such as titanocene. The entire disclosure of WO 2006/079788 in relation to photopolymer preparations is included herein by reference.

Having regard to the shortcomings of CTP technology, for example the use of laser scanning to form an image on resin, it would be desirable to provide an alternative maskless technology for imagewise curing of photopolymer.

SUMMARY OF THE INVENTION

The present invention is based at least in part on a realisation that the use of a masking element may be obviated by exposing photopolymer to an image directly created by a light source and without the use of a mask, e.g. an electronically produced image. For example, the image may be produced by an array of light emitting cells or elements which can be individually turned on or off electronically to create the desired image. The regions of photopolymer exposed to the light areas of the image, e.g. the light emitting cells or elements which are turned on, will cure, creating an image in the polymer; the remaining un-exposed parts will remain as they were before exposure and can be removed by suitable means.

The present invention relates also, therefore, to the creation of a polymerised compound by exposure to light emitted by light emitting cells for which their output is controlled directly by computer, therefore removing any requirement for a mask.

Accordingly, one aspect of the present invention provides a process for curing photopolymer which comprises exposing the photopolymer to an image produced by a mask-free imaging apparatus.

Unlike a conventional laser-implemented CTP process, in which areas of the photopolymer are transiently exposed to laser light, the process of the invention requires exposure of the polymer to an image. The process of the invention therefore provides the benefit of "blanket" exposure of the photopolymer to a curing image, creating a corresponding image in the polymer.

In a particular embodiment, the present invention provides a process for curing photopolymer which comprises exposing the photopolymer to an electronically produced image. This exposed photosensitive polymer is thus created by individual cells being switched either off or on and so either irradiating energy, or not, as dictated by the image design.

A particular benefit of this invention is that it is considerably cheaper and easier to obtain light emitting sources in the format described in this specification than light emitting sources used in exposure units up until this point, namely fluorescent tubes which require ballasts, starters and associated wiring or lasers which are typically expensive and require substantial power.

The invention also provides exposure apparatus for curing photopolymer, which comprises image generating means and a surface on which the photopolymer can be placed and exposed to an image produced by said means.

The image may be produced using a cathode ray tube (CRT), an array of light emitting diodes (LEDs), a liquid crystal display (LCD), a plasma screen, a rear projection screen or other such electronically controlled light emitting device. Other suitable image generating devices may also be utilised in the invention.

The cured photopolymer can be used in the manufacture of flexographic printing plates, synthetic resin relief printing plates, colour proofs, photoresists and colour filters used in three dimensional stereolithography, holography, lithographic printing plates, flexographic printing plates, moulding plates and hand stamps.

In a particular embodiment, the process and apparatus of the disclosure are used to make a hand stamp.

DESCRIPTION OF VARIOUS EMBODIMENTS

The invention relates to the curing of photopolymer. Such photosensitive polymers are according to the invention cured by a process which can provide a good quality image by a convenient digital process.

According to this invention photopolymer is cured by exposure to an image which has been produced by image generating means, e.g. electronic means. By using an electronically-produced or otherwise generated image, the photopolymer can be cured in the absence of a masking element. The invention therefore includes a process for the imagewise curing of a photopolymer without the use of a mask. The image is created by the light source apparatus itself. Typically, the image can be selectively created by the light source. In one embodiment, the image is created on a flat screen. The image may be monochromatic or polychromatic, but typically is black and white i.e. light emitting and non-light emitting. In the event that colour printing plates are required the desired number of colour separation plates are made in the same manner.

The photopolymer is suitably positioned with respect to an electronic image source or other image generator to allow imagewise exposure. This photosensitive polymer preparation is then exposed to the generated image for a time sufficient for imagewise curing of the photosensitive polymer. A suitable exposure time may be determined using a light meter operably connected to a timer device. An appropriate exposure time will often range from about 1 to about 20 minutes, depending on the intensity of light source at the wavelength of the photoinitiators used. After exposure the cured polymer is typically developed using a solvent or heat.

Conveniently the photopolymer may be formulated to include photoinitiators that are active in the visible part of the spectrum, which is where these arrays of small light emitting devices typically work as they are principally designed for viewing by people. Alternatively it is possible to select arrays of light emitting devices that are active in the Ultra Violet part of the spectrum allowing the use of existing commercially available sheet or liquid photopolymer products, but in practice these have proved to be too slow to be practical. The easiest and lowest cost method is to use an array of commercially available light emitting devices, for instance an LCD display coupled with photosensitive polymer activated by visible photoinitiators.

The photopolymer may be in sheet form with the photoinitiators shifted to the visible range or alternatively may be in liquid form with photoinitiators shifted into the visible part of the spectrum.

The liquid photopolymer may be enclosed in a container, for instance a sealed sachet, for convenience of use. Suitable sachets are manufactured by Photocentric Limited (Peterborough, UK) under the brand names imagepac and imagepac xtra (imagepac is a registered trade mark), and are described in U.S. Pat. No. 6,737,219, which is incorporated herein by reference in its entirety, and European Patent Application No. 02755145.6. The photopolymer compositions as previously described herein under the heading "Background to the Invention" may therefore be used in the present invention; as described below, the liquid photopolymer is in many embodiments adapted to be cured by light in the visible part of the spectrum.

Liquid photosensitive polymer may be poured onto glass protecting an electronic imaging producing device, e.g. light emitting array, by methods accepted in the flexographic industry or alternatively it may be supplied ready packed in a sachet. The sachet may be secured in position by clamping, whether physical clamping or by vacuum, typically between opposed sheets of glass or other rigid transparent material. The image producing means may comprise a screen which can act as one of those sheets. Where an image source which generates a substantial amount of heat is used (e.g. a plasma screen), it may be desirable to use a rigid plastics sheet material such as Perspex (a trade mark of DuPont) instead of glass.

Solid photosensitive polymer may be directly placed on top of the electronic image producing device, e.g. light emitting array. In either process it is preferable that the light emitting array or other image source is positioned as close as possible, with as little diffracting lamina (as thin a screen) as practical, between itself and the photopolymer.

As an alternative to juxtaposing the photopolymer against an image source, the image can be projected onto the photosensitive polymer using devices such as rear projection monitors.

This method may allow the production of cured photopolymer plates of any size as the electronic light emitting arrays are produced in a variety of size formats. In some embodiments, the cured photosensitive polymer plates are of approximately standard paper size, for example they may be of about the following dimensions in millimetres, e.g. of the following dimensions ±10 mm, e.g. ±5 mm such as, for example, ±2 mm:

A2 420×594 mm
A3 297×420 mm
A4 210×297 mm
A5 148×210 mm
A6 105×148 mm.

In embodiments, the plates are of no greater size than standard US paper.

The precise identity of the image producing apparatus is not critical to the invention, but it is able to generate images of choice to the user without a mask. In other words, the image producing apparatus can selectively generate images on the instruction of the user, as for example in the case of apparatus comprising a display screen. The images are suitably generated by a monochromatic display screen of which a multiplicity of sub-areas are in a state selected from illuminated and not illuminated, e.g. as in the case of a CRT, LED or LCD screen. Currently, such devices form electronically produced images (images produced by selective operation of an electronically controlled video display screen), but other technologies are also included, e.g. optically controlled display screens. For convenience, the term "electronic image producing means" is used hereinafter to refer to image generators as described in this paragraph.

The electronic image producing means may be a CRT. In a CRT, the cathode is a heated filament in a vacuum created inside the glass tube. The ray is a stream of electrons that are emitted from the heated cathode and are attracted to the positive anode. The stream of electrons is focused by a focusing anode into a tight beam and then accelerated by an accelerating anode. This beam hits a screen at the other end of the tube which is coated with phosphor, which then glows emitting light. It is generally preferred for the screen to be a flat screen.

Another example of image producing means suitable for use in the invention is an array of LEDs. LEDs are semiconductor diodes that typically emit a single wavelength of light when charged with electricity. Various colours can be generated based on the material used for the tips of the probes. Aluminium indium gallium phosphide (AlInGaP) is used for red and yellow. Indium gallium nitride (InGaN) is used for green and blue, and the addition of phosphor, creates white light as well. LEDs can produce a range of wavelengths of radiation and can be chosen to match the peak absorbance of any photoinitiator present in the liquid photopolymer preparation. Current LED technology does not produce light emitting cells small enough to reach industry acceptable resolutions, although this may change in the future.

The invention may conveniently involve the use of an LCD as the image producing means. LCDs consume much less energy than LEDs because it takes less power to move molecules than to energize a light-emitting device. LCDs use rod-shaped molecules (liquid crystals) that exhibit liquid-like flow and bend light. Unenergized, the crystals direct light through two polarizing filters, allowing a natural background color to show. When energized, they redirect the light to be absorbed in one of the polarizers, causing the dark appearance of crossed polarizers to show. The more the molecules are twisted, the better the contrast and viewing angle. Backlit or sidelit screens are generally preferred over the reflective screens commonly used in many consumer appliances and some lightweight laptops, as the latter require external light and only work well in a bright room or with a desk lamp. Backlit and sidelit LCD screens have their own light source and speed up the polymerization process by producing more directly emitted light. As this flexographic process requires only a binary light emission, i.e. on and off states, the commonly produced colour LCD screens can be simplified by being monochromatic and the resolution correspondingly increased. In active matrix displays, a transistor is used to control each subpixel on the screen. For example, a 1024×768 colour screen requires 2,359,296 transistors; one for each red, green and blue subpixel (dot). Active matrix displays provide a sharp, clear image with good contrast and eliminate submarining. Only one transistor per pixel or 786,432 transistors may be needed to achieve the same resolution in the present process. The LCD screen may, for example, be a thin film transistor LCD (TFT LCD) utilizing an active matrix displays with a 90° (TN) twist.

Plasma screens may also be utilised in the invention. Plasma screens emit light by way of phosphors, which emit light when they are exposed to other light. When an ultraviolet photon hits a phosphor atom in the cell, one of the phosphor's electrons jumps to a higher energy level, when the electron falls back to its normal level; it releases energy in the form of a visible light photon.

The photopolymer may be any suitable photopolymer known to those skilled in the art. Suitable photopolymers include, for example, unsaturated polyester resins, unsaturated polyurethane resins, unsaturated polyamide resins and unsaturated poly(meth)acrylate resins, for example polyether urethane polymers, or polyether polyester urethane copolymers such as polyether polyester urethane methacrylate prepolymers. The photopolymer may be provided in a sheet format or in the liquid state, either poured at point of use or supplied in a pre-filled sachet. If liquid photopolymer is used it is typically of a viscosity between the range of 2,000 to 50,000 cps, and more commonly 30,000 to 50,000 cps.

The activation wavelength of many photopolymers lies in the UV region (typically from about 340 nm to about 370 nm). However, CRTs, LCDs and LEDs are designed for viewing purposes and all emit light with peak emission in the visible part of the spectrum (e.g. greater than 400 nm). It is therefore desirable that the photopolymer cures in the same part of the spectrum as the light source and with sufficient speed to cure to a suitable depth in a reasonable period of time such that a user can complete each stage of its operation without excessive waiting, whilst at the same time the liquid or solid photopolymer is stable in manufacture, transit and in use.

It is a feature of embodiments of this invention that the photopolymer has been modified to improve its usability in the visible part of the spectrum. In this respect, it is desirable that the photopolymer reacts under light from the light source with sufficient speed to cure to a suitable depth in a reasonable period of time such that a user can complete each stage of its operation without excessive waiting, whilst at the same being stable in manufacture, transit and in use.

The reactivity of the photosensitive polymer can be optimised by including at least one photoinitiator in the photosensitive polymer preparation. The photopolymer may include a photoinitiator which exhibits an absorbance band in the UV or (near) visible region of the electromagnetic spectrum. The photosensitive polymer may comprise a mixture of photoinitiators.

Aromatic bisacylated phosphine oxides may be used as photoinitiators and may afford coverage in the visible region of the electromagnetic spectrum (370 to 440 nm); typical examples are Lucerine BAPO-1 (BASF), and bis(2,4,6-trimethylbenzoyl) phenyl phosphine oxide, BAPO-3 and blends thereof. More desirably it is possible to use organometallic-based visible photoinitiators such as a titanacene compounds e.g. cyclopentadienyl bis 2,6 difluoro-pyrrol, trade name Irgacure 784 manufactured by Ciba The photopolymer resin used in the formulation can be manufactured to a variety of formulations by anyone skilled in the art. As discussed, the inclusion of a photoinitiator that has the ability to absorb in the visible region of the electromagnetic spectrum is a feature of many embodiments. The level of the photoinitiator that can be of the types disclosed can be broadly at in an amount of, for example, 0.01%-10% and more typically at levels of 0.01% to 4%, the percentages being calculated by weight of the total liquid photopolymer.

Often the amount of photoinitiator is from 0.01% to 1%, e.g. 0.02% to 1%, such as e.g. 0.02% to 0.5%, as in the case of compositions containing 0.03% or more, e.g. 0.04% or more, and/or no more than 0.2%, e.g. no more than 0.1%.

It is desirable that the cure speed of the reaction is adjusted so that it will work satisfactorily under the desired light source or sources. The desired cure speed may achieved by selecting the proportion of photoinitiator by empirical experimentation. It is contemplated that an alternative technique would be to include one or more photoabsorbers in the resin as well as one or more photoinitiators and to balance the levels of the photoinitiators and photoabsorbers in the polymer at amounts where the desired curing times were observed; again, the levels may be determined empirically. It is also contemplates that it contains sensitising dyes to enhance the effectiveness of the photoinitiators. In any event, the cure speed may be selected such that it enables the photopolymer container to be handled in ambient light for long enough for the container to be placed on a light source, without deleterious effects on the plate, whilst at the same time achieving a finished plate within a reasonable period, e.g. a period of between 1 and 15 minutes.

Examples of photoinitiators in certain embodiments include organic aromatic carbonyl compounds such as, for example, unsubstituted or substituted benzophenones such as benzophenone, 4-bromobenzophenone, 4,4'-dichlorobenzophenone, 4,4'-dimethoxybenzophenone, 4-methylbenzophenone, 4-hydroxybenzophenone, 3,5-dihydroxybenzophenone, 4-phenylbenzophenone and deoxybenzophenone; unsubstituted or substituted acetophenones such as acetophenone, 4-methylacetophenone, 3,5-dimethylacetophenone, 4-methoxyacetophenone, 2-chloroacetophenone, 4-chloroacetophenone, 2-chloronitroacetophenone, 32-chloro-5-nitroacetophenone, 2,6-dimethoxyacetophenone, 4-hydroxyacetophenone, α-phenylacetophenone and α,α-dichloroacetophenone; unsubstituted or substituted aromatic ketones such as deoxybenzoin, phenyl naphthyl ketone, benzoin methyl ether, benzoin ethyl ether, benzoin n-propyl ether, benzoin isopropyl ether, benzoin n-butyl ether, benzoin isobutyl ether, benzoin t-butyl ether and other alkyl ethers of benzoin, and α-diketones such as benzil; and various quinone compounds such as p-benzoquinone, 2,5-dimethyl-p-benzoquinone, 2,6-dichloro-p-benzoquinone, 9,10-anthraquinone, 2-methyl-9,10-anthraquinone, 2-ethyl-9,10-anthraquinone, 2-bromo-9,10-anthraquinone, 2-ethyl-5,6,7,8-tetrahydroanthraquinone, 1,4-naphthoquinone, 2,3-dichloronaphthoquinone, 2,3-dimethyl-1,4-naphthoquinone, 2-ethyl-1,4-naphthoquinone, phenanthraquinone and 1,2-naphthoquinone. Examples of other titanocene compounds are bis(cyclopentadienyl)titanium dichloride, bis(cyclopentadienyl)diphenyltitanium, bis(cyclopentadienyl)bis(2,3,4,5,6-pentafluoro-phen-1-yl)titanium, bis(cyclopentadienyl)bis(2,3,5,6-tetrafluorophen-1-yl)titanium, bis-(cyclopentadienyl)bis(2,4,6-trifluoropheny-1-yl)titanium, bis(cyclopentadienyl)bis(2,6-difluorophen-1-yl)titanium, bis(cyclopentadienyl)bis(2,4-difluorophen-1-yl)titanium, bis(methylcyclopentadienyl)bis(2,3,4,5,6-pentafluorophen-1-yl)titanium, bis(methyl-cycxlopentadienyl)bis(2,3,5,6-tetrafluorophen-1-yl)titanium, bis(methylcyclopenta-dienyl)bis(2,4-difluoropheny-1-yl)titanium, bis(cyclopentadienyl)bis[2,6-difluoro-3-(pyr-1-yl)phenyl]titanium, bis(cyclopentadienyl)bis[2,6-difluoro-3-(methylsulfonamido)phenyl]titanium, bis(cyclopentadienyl)bis[2,6-difluoro-3-(N-butylbiaroylamino)phenyl]titanium, bis(cyclopentadienyl)bis[2,6-difluoro-3-(N-ethylacetylamino)phenyl]-titanium, bis(cyclopentadienyl)bis[2,6-difluoro-3-(N-methylacetylamino)phenyl]-titanium, bis(cyclopentadienyl)bis[2,6-difluoro-3-(N-ethylpropionylamino)phenyl]-titanium, bis(cyclopentadienyl)bis[2,6-difluoro-3-(N-ethyl-(2,2-dimethylbutanoyl)amino)phenyl]-titanium, bis(cyclopentadienyl)bis[2,6-difluoro-3-(N-butyl-(2,2-dimethyl-butanoyl)-amino)phenyl-]titanium, bis(cyclopentadienyl)bis[2,6-difluoro-3-(N-pentyl-(2,2-dimethyl-butanoyl)amino)phenyl]titanium, bis(cyclopentadienyl)bis[2,6-difluoro-3-(N-hexyl)-(2,2-dimethylbutanoyl)phenyl]titanium, bis(cyclopentadienyl)bis[2,6-difluoro-3-(N-methylbutyrylamino)phenyl]titanium, bis(cyclopentadienyl)bis[2,6-difluoro-3-(N-methylpentanoylamino)phenyl]titanium, bis(cyclopentadienyl)bis[2,6-difluoro-3-(N-ethylcyclohexylcarbonylamino)phenyl]titanium, bis(cyclopentadienyl)-bis[2,6-difluoro-3-(N-ethylisobutyrylamino)phenyl]titanium, bis(cyclopentadienyl)-bis[2,6-difluoro-3-(2,2,5,5-tetramethyl-1,2,5-1-azadisilolidin-1-yl)phenyl]titanium, bis-(cyclopentadienyl)bis[2,6-difluoro-3-(octylsulfonamido)phenyl]titanium bis(cyclopentadienyl)bis[2,6-difluoro-3-(4-tolylsulfonamido)phenyl]titanium, bis(cyclopentadienyl)bis[2,6-difluoro-3-(4-dodecylphenylsulfonylamido)-phenyl]titanium, bis(cyclopentadienyl)bis[2,6-difluoro-3-(4-(1-pentylheptyl)phenylsulfonyl-amido)phenyl]titanium, bis-(cyclopentadienyl)bis[2,6-difluoro-3-(ethylsulfonylamido)phenyl]titanium, bis(cyclo-pentadienyl)bis[2,6-difluoro-3-((4-bromophenyl)sulfonylamido)phenyl]titanium, bis(cyclopentadienyl)bis[2,6-difluoro-3-(2-naphthylsulfonylamido)phenyl]titanium, bis-(cyclopentadienyl)bis[2,6-difluoro-3-(hexadecylsulfonylamido)phenyl]titanium, bis-(cyclopentadienyl)bis[2,6-difluoro-3-(N-methyl-(4-dodecylphenyl)sulfonylamido)-phenyl-]titanium, bis (cyclopentadienyl)bis[2,6-difluoro-3-(N-methyl-4-(1-pentylheptyl)phenyl)sulfonylamido)]titanium, bis (cyclopentadienyl)bis[2,6-difluoro-3-(N-hexyl-(4-tolyl)sulfonylamido)phenyl]titanium, bis(cyclopentadienyl)bis[2,6-difluoro-3-(pyrrolidine-bis(cyclopentadienyl)bis[2,6-difluoro-3-2,5-dion-1-yl)phenyl-]titanium, (3,4-dimethyl-3-pyrroli-dine-2,5-dion-1-yl)phenyl]titanium, bis(cyclopentadienyl)-bis[2,6-difluoro-3-(phthalimido)phenyl]titanium, bis(cyclopentadienyl)bis[2,6-difluoro-3-isobutoxycarbonylamino)phenyl]titanium, bis(cyclopentadienyl)bis[2,6-difluoro-3-(ethoxycarbonylamino)phenyl-]titanium, bis(cyclopentadienyl)bis[2,6-difluoro-3-((2-chloroethoxy)carbonylamino)phenyl]titanium, bis(cyclopentadienyl)bis[2,6-difluoro-3-(phenoxycarbonylamino)phenyl]titanium, bis(cyclopentadienyl)bis[2,6-difluoro-3-(3-phenylthioureido)phenyl]titanium, bis(cyclopentadienyl)bis[2,6-difluoro-3-(3-butylthioureido)phenyl-]titanium, bis(cyclopentadienyl)bis[2,6-difluoro-3-(3-phenylureido)-phenyl]-titanium, bis(cyclopentadienyl)bis[2,6-difluoro-3-(3-butylureido)phenyl]tit-anium, bis(cyclopentadienyl)bis[2,6-difluoro-3-(N,N-diacetylamino)phenyl]-titanium, bis(cyclopentadienyl)bis[2,6-difluoro-3-(3,3-dimethylureido)phenyl]titanium, bis(cyclo-pentadienyl)bis[2,6-difluoro-3-(acetylamino)phenyl]titanium, bis(cyclopentadienyl)-bis[2,6-difluoro-3-(butyrylamino)phenyl]titanium, bis(cyclopentadienyl)bis[2,6-difluoro-3-(decanoylamino)phenyl]titanium, bis(cyclopentadienyl)bis[2,6-difluoro-3-(octadecanoylamino)phenyl]titanium, bis(cyclopentadienyl)bis[2,6-difluoro-3-(isobutyrylamino)phenyl]titanium, bis(cyclopentadienyl)bis[2,6-difluoro-3-(2-ethylhexanoylamino)phenyl]titanium, bis(cyclopentadienyl)bis[2,6-difluoro-3-(2-methylbutanoylamino)phenyl]titanium, bis(cyclopentadienyl)bis[2,6-difluoro-3-

(pivaloylamino)phenyl]titanium, bis(cyclopentadienyl)bis[2,6-difluoro-3-(2,2-dimethylbutanoylamino-)phenyl-]titanium, bis(cyclopentadienyl)bis[2,6-difluoro-3-(2-ethyl-2-methyl-heptan-oylamino)phenyl]titanium, bis(cyclopentadienyl)bis[2,6-difluoro-3-(cyclohexylcarbonylamino)phenyl]titanium, bis(cyclopentadienyl)bis[2,6-difluoro-3-(2,2-dimethyl-3-chloropropanoylamino)phenyl]titanium, bis(cyclopentadienyl)bis[2,6-difluoro-3-(3-phenylpropanoylamino)phenyl]titanium, bis(cyclopentadienyl)bis[2,6-difluoro-3-(2-chloromethyl-2-methyl-3-1-chloropropanoylamino)phenyl]titanium, bis(cyclopenta-dienyl)bis[2,6-difluoro-3-(3,4-xyloylamino)phenyl]titanium, bis(cyclopentadienyl)bis-[2,6-difluoro-3-(4-ethylbenzoylamino)phenyl]titanium, bis(cyclopentadienyl)bis[2,6-difluoro-3-(2,4,6-mesitylcarbonylamino)phenyl]titanium, bis(cyclopentadienyl)-bis[2,6-difluoro-3-(benzoylamino)phenyl]titanium, bis(cyclopentadienyl)bis[2,6-difluoro-3-(N-(3-phenylpropyl)benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluoyl)amino)phenyl]titanium, bis(cyclopentadienyl)bis[2,6-difluoro-3-(N-isobutylbenzoylamino)phenyl]titanium, bis(cyclopentadienyl)bis[2,6-difluoro-3-(N-cyclohexylmethylpivaloy-lamino)phenyl]titanium, bis-(cyclopentadienyl)bis[2,6-difluoro-3-(N-(oxolan-2-ylmethyl)benzoylamino)phenyl]-titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl-(4-toluoyl)amino)phenyl]titanium, bis(cyclopentadienyl)bis[2,6-difluoro-3-(N-(oxolan-2-ylmethyl)-(4-toluoyl)-amino)phenyl)titanium, bis(cyclopentadienyl)bis[2,6-difluoro-3-(N-(4-toluoylmethyl)benzoylamino)phenyl]titanium, bis(cyclopentadienyl)bis[2,6-difluoro-3-(N-(4-toluoylmethyl)-(4-toluoyl)amino)phenyl]titanium, bis(cyclopentadienyl)bis[2,6-difluoro-3-(N-butylbenzoylamino)phenyl]titanium, bis(cyclopentadienyl)bis[2,6-difluoro-3-(N-butyl-(4-toluoyl)amino)phenyl]titanium, bis(cyclopentadienyl)bis[2,6-difluoro-3-(N-hexyl-(4-toluoyl)amino)phenyl]titanium, bis(cyclopentadienyl)bis[2,6-difluoro-3-(N-(2,4-dimethylpentyl)-2-,2-dimethylbutanoylamino) phenyl]titanium, bis(cyclopentadienyl)bis[2,6-difluoro-3-(2,4-dimethylpentyl)-2,2-dimethyl-pentanoylamino)phenyl]titanium, bis(cyclopentadienyl)bis[2,6-difluoro-3-((4-toluoyl)amino)phenyl]titanium, bis(cyclopentadienyl)bis[2,6-difluoro-3-(2,2-dimethyl-pentanoylamino)phenyl]titanium, bis(cyclopentadienyl)bis[2,6-difluoro-3-(2,2-dimethyl-3-ethoxypropanoylamino)phenyl]titanium, bis(cyclopentadienyl)bis[2,6-difluoro-3-(2,2-dimethyl-3-allyloxypropanoylamino)phenyl]titanium, bis(cyclopentadienyl)bis[2,6-difluoro-3-(N-allylacetylamino)phenyl]titanium, bis(cyclopenta-dienyl)bis[2,6-difluoro-3-(2-ethylbutanoylamino)phenyl]titanium, bis(cyclopenta-dienyl)bis(2,6-difluoro-3-(N-cyclohexylmethylbenzoy-lamino)phenyl]titanium, bis-(cyclopentadienyl)bis[2,6-difluoro-3-(N-cyclohexylmethyl-(4-toluoyl)amino)phenyl]-titanium, bis(cyclopentadienyl)bis[2,6-difluoro-3-(N-(2-ethylhexyl)benzoylamino)phenyl]titanium, bis(cyclopentadienyl)bis[2,6-difluoro-3-(N-isopropylbenzoylamino)phenyl]titanium, bis(cyclopentadienyl)bis[2,6-difluoro-3-(N-phenylpropyl)-2,2-dimethylpentanoyl]amino)phenyl]titanium, bis(cyclopentadienyl)bis[2,6-difluoro-3-(N-hexylbenzoylamino)phenyl]titanium, bis(cyclo-pentadienyl)bis[2,6-difluoro-3-(N-cyclohexylmethyl-2,2-dimethylpentanoyl)amino)phenyl-]titanium, bis(cyclopeantadienyl)bis[2,6-difluoro-3-(N-butylbenzoyl-amino)-phenyl]titanium, bis(cyclopentadienyl)bis[2,6-difluoro-3-(N-(2-ethylhexyl)-2,2-dimethylpentanoyl)amino)phenyl]-titanium, bis(cyclopentadienyl)bis[2,6-difluoro-3-(N-hexyl-2,2-dimethylpentanoyl-amino)phenyl]titanium, bis(cyclopentadienyl)bis[2,6-difluoro-3-(N-isopropyl-2,2-dimethylpentanoylamino)phenyl]titanium, bis(cyclopentadienyl)bis[2,6-difluoro-3-(N-3-phenylpropyl)pivaloylamino)phenyl]titanium, bis(cyclopentadienyl)bis[2,6-difluoro-3-(N-butyl-2,2-dimethylpentanoylamino)phenyl]titanium, bis (cyclopentadienyl)bis[2,6-difluoro-3-(N-(2-methoxyethyl)benzoylamino)phenyl]titanium, bis(cyclopenta-dienyl)bis[2,6-difluoro-3-(N-benzylbenzoylamino)phenyl]titanium, bis-(cyclopenta-dienyl)bis[2,6-difluoro-3-(N-benzyl-(4-toluoyl)amino)phenyl]titanium, bis-(cyclopean-tadienyl)bis[2,6-difluoro-3-(N-(2-methoxyethyl)-(4-toluoyl)amino)phenyl-]titanium, bis-(cyclopentadienyl)bis[2,6-difluoro-3-(4-methylphenyl-methyl)-2,2-dimethyl-pentan-oylamino)phenyl]titanium, bis(cyclopentadienyl)bis[2,6-difluoro-3-(N-(2-methoxyethyl)-2,2-dimethylpentanoylamino)phenyl]titanium, bis(cyclopentadienyl)bis[2,6-difluoro-3-(N-cyclohexylmethyl-(2-ethyl-2-methylheptanoyl)aminophenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-hexyl-(2-ethyl-2-methylbutanoyl-)amino)phenyl]titanium, bis(cyclopentadienyl)bis[2,6-difluoro-3-(N-cyclohexyl-2,2-dimethylpentanoylamino)phenyl]titanium, bis(cyclopentadienyl)bis[2,6-difluoro-3-(N-(oxolan-2-ylmethyl)-2,2-dimethylpentanoyl)amino)phenyl]titanium, bis(cyclopentadienyl)-bis-[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chlorobenzoyl)amino)phenyl]titanium, bis(cyclopentadienyl)bis[2,6-difluoro-3-(3,3-dimethyl-2-azetidinon-1-yl)phenyl]titanium, bis(cyclopentadienyl)bis(2,6-difluoro-3-isocyanatophenyl)titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]-titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropanoyl)-2,2-dimethyl-3-chloropropanoyl)amino)phenyl]titanium, bis(cyclopentadienyl)bis[2,6-difluoro-3-(N-cyclohexylmethyl-(2,2-dimethyl-1-3-chloro-propanoyl)amino)phenyl]titanium, bis(cyclopentadienyl)bis[2,6-difluoro-3-(N-isobutyl-(2,2-dimethyl-3-chloropropanol)phenyl]titanium, bis(cyclopentadienyl)bis[2,6-difluoro-3-(N-butyl-(2-chloromethyl-2-methyl-1-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl)titanium, bis(methylcyclopentadienyl)bis[2,6-difluoro-3-(N-hexyl-2,2-dimethylbutanoyl)amino-)phenyl]titanium, bis(methylcyclopentadienyl)bis[2,6-difluoro-3-(N-hexyl-2,2-dimethyl pentanoylamino)phenyl)titanium, bis(methylcyclopentadienyl)bis[2,6-difluoro-3-(N-ethyl-acetyl]amino)phenyl-]titanium, bis(methylcyclopentadienyl)bis[2,6-difluoro-3-(N-ethylpropionylamino)phenyl]titanium, bis (trimethylsilylpentadienyl)bis[2,6-difluoro-3-(N-butyl-2,2-dimethylpro-panoylamino)phenyl]titanium, bis(cyclopentadienyl)bis[2,6-difluoro-3-(N-(2-methoxyethyl)-trimethylsilylamino)phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-trimethylpropyl)dimethylsilylamino)phenyl]titanium, bis(cyclopentadienyl)bis[2,6-difluoro-3-(3-ethoxymethyl-3-methyl-2-azethi-odinon-1-yl)phenyl]titanium, bis(cyclopentadienyl)bis[2,6-difluoro-3-(3-allyl-oxymethyl-3-methyl-2-azet-idinon-1-yl)phenyl]titanium, bis(cyclopentadienyl)bis[2,6-difluoro-3-(3-chloromethyl-3-methyl-2-azetid-inon-1-yl)phenyl]titanium, bis(cyclo-pentadienyl)bis[2,6-difluoro-3-(N-benzyl-2,2-dimethylpropanoy-lamino)phenyl]titanium, bis(cyclopentadienyl)bis[2,6-difluoro-3-(5,5-dimethyl-2-pyrrodininon-1-yl-)phenyl-]titanium, bis(cyclopentadienyl)bis[2,6-difluoro-3-(6,6-diphenyl-2-piperidinon-1-yl)phenyl]titanium, bis(cyclopentadienyl)bis[2,6-difluoro-3-(N-(2,3-dihydro-1,2-benzoisothiaz-ol-3-one(1,1-dioxide)-2-yl)phenyl]titanium, bis(cyclopentadienyl)bis[2,6-difluoro-3-(N-hexyl-(4-chlorobenzoyl)amino)phenyl]titanium, bis(cyclopenta-dienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4-methylphenylmethyl)-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopenta-dienyl)bis[2,6-difluoro-3-(N-(2-ethylhexyl)-4-tolyl-sulfonyl)amino)phenyl]titanium, bis(cyclopentadienyl)bis[2,6-difluoro-3-(N-(3-oxaheptyl)benzoylamino)phenyl-]titanium, bis(cyclopentadienyl)bis[2,6-difluoro-3-(N-(3,6-dioxadecyl)benzo-ylamino)phenyl]titanium, bis(cyclopentadienyl)bis[2,6-difluoro-3-(trifluoromethyl-sulfonyl)amino)phenyl]titanium, bis(cyclopentadienyl)bis[2,6-difluoro-3-(trifluoro-acetylamino)phenyl]titanium, bis(cyclopentadienyl)bis[2,6-difluoro-3-(2-chloro-benzo-yl)amino)phenyl]titanium, bis(cyclopentadienyl)bis[2,6-difluoro-3-(4-chlorobenzoyl)-amino)phenyl]titanium, bis(cyclopentadienyl)bis[2,6-difluoro-3-(N-(3,6-dioxadecyl)-2,2-dim-ethylpentanoylamino)phenyl]titanium, bis(cyclopentadienyl)bis[2,6-difluoro-3-(N-(3,7-dimethyl-7-methoxyoctyl)benzoylamino)phenyl]titanium, and bis(cyclo-pentadienyl)bis[2,6-difluoro-3-(N-cyclohexylbenzoylamino)phenyl]titanium.

The photoinitiator may be also be selected from camphorquinone and 1-phenyl-1,2-propanedione, monoacylphosphine oxide, bisacylphosphine oxide, diaryliodonium salt and triarylsulfonium salt.

Furthermore, the photoinitiator may comprise a mixture of compounds, for example a mixture of one or more of the above named compounds.

Included in the present disclosure are photopolymer preparations and compositions containing an aromatic phosphine oxide, more specifically a bis-acylphosphineoxide.

In one embodiment, the composition further comprises an activator which can be used together with a photoinitiator to enhance curing efficiency. In one embodiment, the activators may comprise tertiary amine or sulfinate compounds, or combinations thereof. Examples of activators which could be used in the present invention include, but are not limited to, e.g. ethyl 4-(N,N-dimethylamino) benzoate, 2-(ethylhexyl)-4-(N,N-dimethylamino) benzoate, N,N-dimethylaminoethyl methacrylate, N,N-dimethylaminophenethyl alcohol, sodium benzenesulfinate, and sodium toluenesulfinate, and combinations thereof.

In one embodiment, the composition comprises a combination of camphoroquinone and a tertiary amine such as ethyl 4-(N,N-dimethylamino) benzoate, 2-(ethylhexyl)-4-(N,N-dimethylamino) benzoate, N,N-dimethylaminoethyl methacrylate, or N,N-dimethylaminophenethyl alcohol, or a combination thereof. In another embodiment, the composition comprises a combination of camphoroquinone and bisacylphosphine oxide and/or monoacylphosphine oxide.

In one embodiment, the composition further comprises one or more performance-enhancing additives including, for example, esters of acrylic or methacrylic acid, stabilisers, defoamers, dyes and high molecular weight fatty acids. Examples of fatty acids which are particularly effective in ensuring a dry, tack-free surface after post-curing of the washed plate include for example myristic acid.

The rate of cure of the photopolymer may be optimised with respect to the particular electronic image source utilised. For example, the minimum exposure time may be selected to give 3 minutes main exposure using a CRT, while the maximum required exposure may be selected to give 15 minutes main exposure using a LCD display. Such variation in cure speed may be achieved by optimising the levels of the photoinitiators and photoabsorbers in the polymer. The levels may be determined empirically. As a result, the photopolymer can be handled in ambient light for long enough to place in an exposure unit and use, typically just under a minute, without deleterious effects on the plate.

The photosensitive polymer preparation may also contain any one or more of a range of further performance-enhancing additives including, for example, esters of acrylic or methacrylic acid, stabilisers, defoamers, dyes and high molecular weight fatty acids; the fatty acids, for example myristic acid, are particularly effective in ensuring a dry, tack-free surface after post-curing of the washed plate.

The invention also provides an exposure apparatus, comprising an image source adapted for the selective generation of images and a surface on which photosensitive polymer can be placed and exposed to the image. The surface may be provided by a screen which is part of the image source, or it may be provided by another transparent screen or lamina. Typically, liquid photopolymer is either poured onto a protective plastic lamina lying on the imaging source or more suitably provided in a container suitably positioned with respect to the image source to allow imagewise curing of the liquid photopolymer; in an alternative embodiment solid photosensitive polymer is placed onto the image source in sheet form. The electronic image source and the container or surface are preferably movable with respect to one another, to allow the image source to be brought into close contact with the photosensitive polymer. It is further desirable that a vacuum can be drawn between the image source and the photosensitive polymer to prevent air from impairing the resultant image. The image source preferably comprises a flat screen. The image source is preferably capable of producing, or adapted to produce, a monochromatic image. The image source is preferably a high resolution array of light emitting cells.

In a particular embodiment, the apparatus comprises:
  a screen capable of being placed in a horizontal orientation; and/or
  a holding device or securing means (in the case of a photopolymer sheet or sachet, the device for example comprises a transparent plate or pair of transparent plates), to enable the photosensitive polymer to be placed as a body having major surfaces in parallel with the screen (and the sheet or sachet in direct contact with the screen); and/or a source of back illumination, for example ambient light, which can be used to form a base in the event that it is exposing liquid or sheet photopolymer. As an alternative to this, the apparatus may be adapted to allow containers of photosensitive polymer with pre-exposed floors or the ability to reverse the holding device or securing means to expose the reverse to the same light source with constant illumination to produce the floor The apparatus may comprise an aperture or inlet into which is fed a sachet or other container of liquid photopolymer, the solid photopolymer plate or the lithographic photosensitive plate. The apparatus may include an in-feed mechanism for automatically feeding the sachet into the unit and placing it in an exposure position where it is to be exposed to an electronic image source. In embodiments the sachet may be fed from a cartridge of sachets or a sachet store included in the apparatus. The photosensitive polymer may, for example, be placed against a screen of an image source as previously discussed and clamped between the screen and a transparent plate, or arranged generally in parallel juxtaposition to a screen of the image source.

The apparatus comprises an image source as previously described, usually an electronic apparatus which is typically controlled using a microprocessor operably connected thereto, allowing control of the image generated. The image is conveniently displayed to the user on a personal computer screen and this image is then transmitted to the apparatus, for example to an array of light emitting sources in the apparatus, that will expose the photopolymer in a similar way to that in which the image is displayed to the user.

The apparatus may include a mechanism for automatically removing the exposed photopolymer from the exposure position. In a particular embodiment, the apparatus includes a device for washing the photopolymer plate and drying it. Thus, there may be a reservoir present in the apparatus, from which a washing solution may flow or be caused to flow which is used to wash the cured polymer plate. The apparatus may include a water inflow conduit for coupling to an external water tap. In embodiments, the apparatus includes a reservoir for water. Also disclosed are apparatuses which include a reservoir for wash liquid (washing solvent).

The apparatus may comprise a bath to which the cured photopolymer is transferred after removal from the plate for washing. The apparatus may include a transfer device for transferring the sachet, e.g. from an opening area where the sachet is opened, to the bath. Typically, a spray head or heads are arranged to spray wash out liquid on a cured plate located in the bath. The spray head or heads are in liquid communication with a source of wash liquid, for example a mixing chamber where water and detergent received in the mixing chamber from a detergent reservoir are mixed. The apparatus may further comprise a drain or a reservoir to which used wash liquid may flow or be pumped; when the apparatus has a reservoir it is preferably capable of indicating or revealing to the user (e.g. through a window or sensor present in the apparatus) that the reservoir is full.

As mentioned, a device for drying the washed photosensitive polymer may be included in the apparatus, drying typically being effected by contacting the cured photosensitive polymer with a warm air current. The dryer device therefore typically includes a fan for creating an air current and, usually, a heater for heating air propelled by the fan. The finished photopolymer plate may be fed out of the apparatus by a feed mechanism. The apparatus may include an outlet aperture through which the finished plate is fed.

The apparatus may be adapted to use a sachet of a size hereinbefore described.

Various aspects of the invention will now be particularly described with reference to the following Examples, which involve the use of sachet technology as described in U.S. Pat. No. 6,737,219 and European Patent Application No. 02755145.6. The photopolymer is adapted to be cured by visible light as described in WO 2006/079788, the contents of all of which are incorporated herein by reference. Examples 1 to 3 describe the production of sachet photopolymer preparations, while Examples 4 and 5 describe imagewise curing of photopolymer in the absence of a mask.

EXAMPLE 1

To a mixture of 1500 parts by weight of polyether polyol (2.0 terminal hydroxyl groups per molecule and an average molecular weight of 3600), 1 part of butylated hydroxy toluene (BHT), 10 parts of triphenyl phosphite and 100 ppm of dibutyl tin dilaurate (DBTDL) was added 120 parts of by weight of 2,4-toluene diisocyanate (TDI). The resulting mixture was reacted at 80° C. for 3.0 hours to obtain a polyurethane oligomer having isocyanate groups at both ends of the molecule. To this were added 35 parts by weight of hydroxypropyl methacrylate and 20 ppm of dibutyl tin dilaurate (DBTDL) after which the reaction mixture was stirred at 70° C. until no residual isocyanate could be determined by titration with di-n-butylamine. To 1500 grams of the foregoing prepolymer were added 625 grams of polypropylene glycol monomethacrylate and 125 grams of hydroxypropyl methacrylate (HPMA) and 2 grams of hydroxy cyclohexyl phenyl ketone and 1 gram of bis(2,4,6-trimethylbenzoyl)-phenylphosphine oxide and 0.1 gram of bis($\eta^5$-2,4-cyclopentadien-1-yl)-bis(2,6-difluoro-3-(1H-pyrrol-1-yl)-phenyl) titanium. The resulting mixture was mixed for 1 hour to obtain a photosensitive resin composition.

The resin was then discharged into a sachet with a fill level to ensure a plate thickness of 2.55 mm.

EXAMPLE 2

To a mixture of 1500 parts by weight of polyether polyol (2.0 terminal hydroxyl groups per molecule and an average molecular weight of 3600), 1 parts of butylated hydroxy toluene (BHT), 10 parts of triphenyl phosphite and 100 ppm of dibutyl tin dilaurate (DBTDL) was added 120 parts of by weight of 2,4-toluene diisocyanate (TDI). The resulting mixture was reacted at 80° C. for 3.0 hours to obtain a polyurethane oligomer having isocyanate groups at both ends of the molecule. To this were added 35 parts by weight of hydroxypropyl methacrylate and 20 ppm of dibutyl tin dilaurate (DBTDL) after which the reaction mixture was stirred at 70° C. until no residual isocyanate could be determined by titration with di-n-butylamine. To 1500 grams of the foregoing prepolymer were added 625 grams of polypropylene glycol monomethacrylate and 125 grams of hydroxypropyl methacrylate (HPMA) and 2 grams of hydroxy cyclohexyl phenyl ketone and 1.5 gram of bis(2,4,6-trimethylbenzoyl)-phenylphosphine oxide and 0.5 gram of bis($\eta^5$-2,4-cyclopentadien-1-yl)-bis(2,6-difluoro-3-(1H-pyrrol-1-yl)-phenyl) titanium. And the resulting mixture was mixed for 1 hour to obtain a photosensitive resin composition. The resin was then discharged into a sachet with a fill level to ensure a plate thickness of 2.55 mm.

EXAMPLE 3

To a mixture of 1500 parts by weight of polyether polyol (2.0 terminal hydroxyl groups per molecule and an average molecular weight of 3600), 1 parts of butylated hydroxy toluene (BHT), 10 parts of triphenyl phosphite and 100 ppm of dibutyl tin dilaurate (DBTDL) was added 120 parts of by weight of 2,4-toluene diisocyanate (TDI). The resulting mixture was reacted at 80° C. for 3.0 hours to obtain a polyurethane oligomer having isocyanate groups at both ends of the molecule. To this were added 35 parts by weight of hydroxypropyl methacrylate and 20 ppm of dibutyl tin dilaurate (DBTDL) after which the reaction mixture was stirred at 70° C. until no residual isocyanate could be determined by titration with di-n-butylamine. To 1500 grams of the foregoing prepolymer were added 625 grams of polypropylene glycol monomethacrylate and 125 grams of hydroxypropyl methacrylate (HPMA) and 2 grams of hydroxy cyclohexyl phenyl ketone and 2.0 gram of bis(2,4,6-trimethylbenzoyl)-phenylphosphine oxide and 0.1 gram of bis($\eta^5$-2,4-cyclopentadien-1-yl)-bis(2,6-difluoro-3-(1H-pyrrol-1-yl)-phenyl) titanium. The resulting mixture was mixed for 1 hour to obtain a photosensitive resin composition. The resin was then discharged into a sachet with a fill level to ensure a plate thickness of 2.55 mm.

EXAMPLE 4

An LCD screen manufactured by Samsung, model number LTB213QR-L02 21.3" QXGA (2048×1536 pixels), 1500nit, 2000:1 CR, 10 bit was used as the illumination source. An A6 sized (148 mm×105 mm) sachet was pre-filled with 39 g of light sensitive resin. When compressed this sachet provided a plate with thickness of 2.3 mm, suitable for stamp printing. The resin was formulated to be active in daylight region by the addition of photoinitiators that have a peak absorbance above 400 nm. This ambient light curing photopolymer was able to polymerise reasonably quickly under the intensity of light emitted from the LCD screen. The sachet was clamped between two sheets of glass so that it took a planar parallel composition, 2.3 mm thick. It was placed over the LCD display and exposed to daylight for 3 minutes to create a floor or support to the stamp. The screen was then shielded from natural light and the desired image was created on the screen that the printed image was to be made from. This image was inverted so that blacks and whites were interchanged. With the sachet clamped in glass, positioned directly over this image on the screen, the assembly was left for 15 minutes. The sachet was then removed, the side that was exposed to light from the LCD screen was cut around its perimeter just in from the seal. The cut piece of plastic was removed and the liquid resin was removed by washing with a brush in warm water and detergent. The plate was placed under water under normal ambient light for a further 10 minutes to dry the surface and to further harden the plate. The plate was inked and stamped and shown to provide an accurate representation of the image displayed on the screen.

EXAMPLE 5

A backlit CRT television screen with 1024×7678 pixels generating 96 dpi screen resolution was used as the illumination source. An A6 sized (148 mm×105 mm) sachet pre-filled with 39 g of light sensitive resin was used. When compressed this sachet provided a plate having a thickness of 2.3 mm, suitable for stamp printing. The resin was formulated to be active in daylight region by the addition of photoinitiators that have a peak absorbance above 400 nm. This ambient light curing photopolymer was able to polymerise reasonably quickly under the intensity of light emitted from the CRT screen. The sachet was clamped between two sheets of glass so that it took a planar parallel composition, 2.3 mm thick. It was placed in front of the CRT display and exposed to daylight for 3 minutes to create a floor or support to the stamp. The screen was then shielded from natural light and the desired image was created on the screen that the printed image was to be made from. This image was inverted so that blacks and whites were interchanged. With the sachet clamped in glass, positioned directly in front of this image on the screen, the assembly was left for 15 minutes. The sachet was then removed, the side that was exposed to light from the CRT screen was cut around its perimeter just in from the seal. The cut piece of plastic was removed and the liquid resin was removed by washing with a brush in warm water and detergent. The plate was placed under water under normal ambient light for a further 10 minutes to dry the surface and to further harden the plate. The plate was inked and printed and shown to provide an accurate representation of the image displayed on the screen.

The invention claimed is:

1. A method of making an image recording material, comprising providing a photosensitive polymer preparation comprising a photoinitiator activated by visible light; creating an image by actuating a liquid crystal display apparatus, the liquid crystal display apparatus having a screen; wherein the screen has a back and a side and is illuminated with a visible light from the back or from the side of the screen; and wherein a light source is located in the screen; and exposing the photosensitive polymer preparation to the image.

2. A method according to claim 1 wherein the image recording material is a flexographic printing plate or hand stamp plate.

* * * * *